United States Patent [19]

Harvey et al.

[11] Patent Number: 4,996,628
[45] Date of Patent: Feb. 26, 1991

[54] BASE FOR STACKABLE ASSEMBLIES

[75] Inventors: Robert T. Harvey, Wichita, Kans.; David C. White, Cincinnati, Ohio

[73] Assignee: NCR Corporation, Dayton, Ohio

[21] Appl. No.: 423,914

[22] Filed: Oct. 19, 1989

[51] Int. Cl.$^5$ .............................................. H05K 7/00
[52] U.S. Cl. .................................... 361/393; 248/679; 307/150; 361/399; 361/417; 361/419
[58] Field of Search ........................ 248/679; 307/150; 312/208, 252, 254; 361/331-332, 380, 391-395, 399, 417, 419, 420; 364/708

[56] References Cited

U.S. PATENT DOCUMENTS

| | | | |
|---|---|---|---|
| 3,219,400 | 11/1965 | Bergquist | 312/107 |
| 3,751,127 | 8/1973 | Black, Jr. et al. | 312/111 |
| 3,824,472 | 7/1974 | Engel et al. | 361/391 |
| 4,354,655 | 10/1982 | Hengst | 248/679 |
| 4,592,601 | 6/1986 | Hlinsky et al. | 312/111 |
| 4,600,250 | 7/1986 | Windham | 312/208 |
| 4,624,510 | 11/1986 | Jedziniak | 312/252 |
| 4,643,494 | 2/1987 | Marleau | 312/111 |
| 4,680,674 | 7/1987 | Moore | 361/396 |
| 4,734,874 | 3/1988 | Hwang et al. | 361/391 |

FOREIGN PATENT DOCUMENTS 1265523  12/1961  France .............. 361/394

Primary Examiner—Gregory D. Thompson
Attorney, Agent, or Firm—Wilbert Hawk, Jr.; Stephen F. Jewett; Jack R. Penrod

[57] ABSTRACT

An interlocking base for use with stacked interlocking electronic assemblies which increases the mechanical stability of the base-stack combination. The increased stability allows a stack of up to four electronics assemblies to be subjected to an inclination of 15 degrees from the vertical in any direction without falling over. The base is furnished with an AC power cord and an ON/OFF AC power switch to provide single switch control of the ACs power conducted to the electronic assemblies of the stack. Single switch control saves operator time and motion, and also prevents accidentally leaving one of the assemblies of the stack ON while turning all the others OFF at the completion of work.

9 Claims, 3 Drawing Sheets

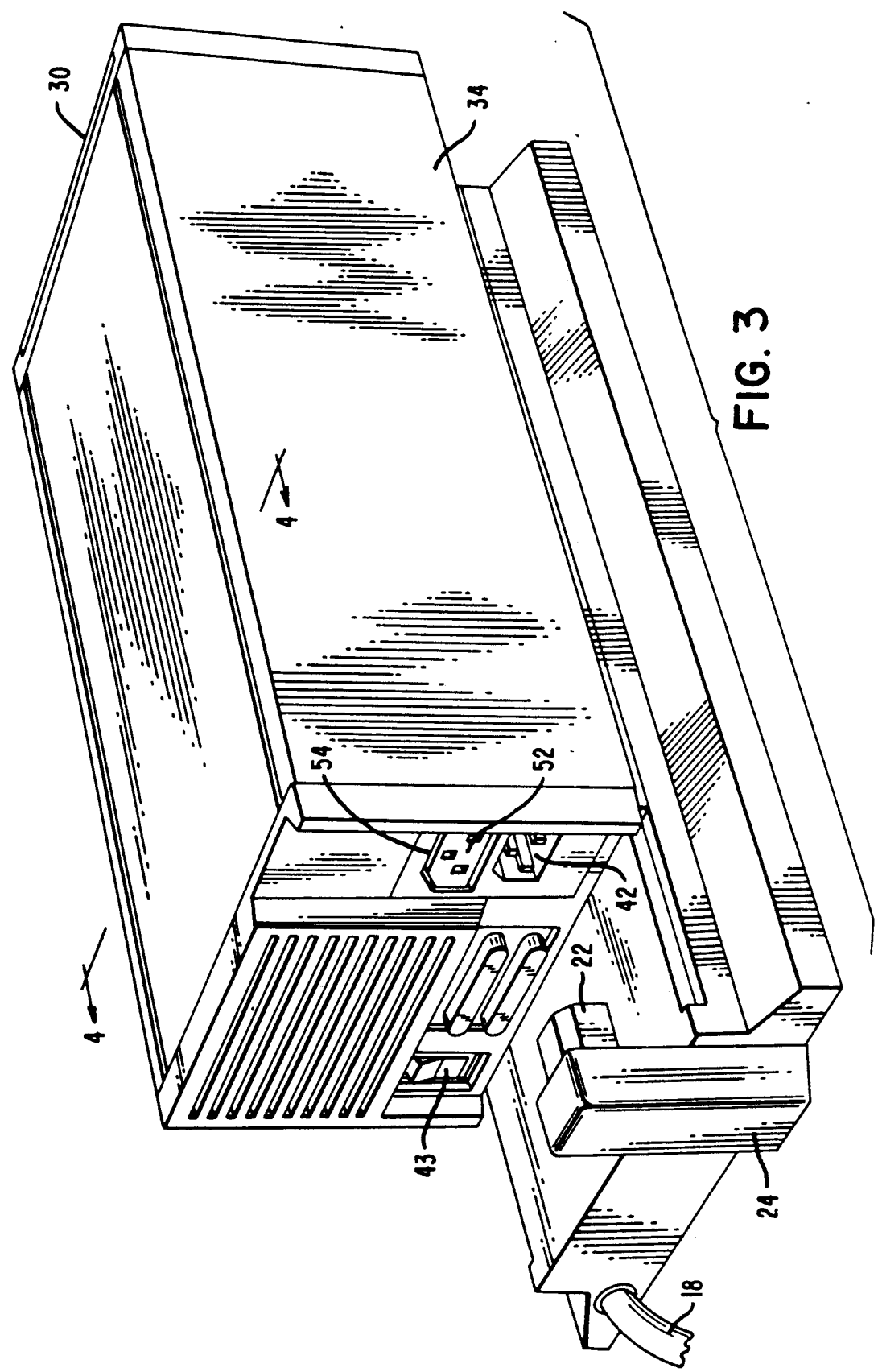

BASE FOR STACKABLE ASSEMBLIES

BACKGROUND OF THE INVENTION

The present invention relates to a base which increases the stability of a vertical stack of electronic assemblies, and more particularly to a stability base which provides single switch ON/OFF control of the AC power to the vertical stack of electronic assemblies.

Often, an electrical or electronic system consists of one main assembly and one or more secondary assemblies. A typical personal computer, for example, has a main assembly which has a power supply, a central-processor-unit circuit board, a memory circuit board, a video display monitor interface board, a printer interface board, a keyboard interface and one or more disk drives within its enclosure. A keyboard, a video display monitor, and a printer are a few of the secondary assemblies which may be connected to the main assembly. A typical multi-user system, as another example, has a main assembly which has a power supply, one or more central processor circuit boards, one or more memory circuit boards, one or more interface boards for video display terminals, one or more printer interface boards and one or more disk drives within its enclosure. In both the personal computer system and the multi-user system there is limited space for additional disk drives and/or tape drives in the main assembly, thus there is a need for additional assemblies for additional disk drives, tape drives, and so forth.

Tape drives and write-once-read-many (WORM) optical disk drives are used for archival and backup purposes primarily to prevent loss of critical information in case of a hard disk failure, a hardware/software failure, or a system disaster. Since the tape cassettes and the WORM disks used are operator removable, these drives are best located at desk top level to facilitate ease of operation.

Hard drives, even though most hard disk drives do not have operator removable media, do have activity indicators which show when the drive is READING or WRITING data, and power switches by which the drives may be turned on/off. Because of these features, hard drives should also be located at desk top level for ease of operation.

Thus, it is desirable to have various types of drives available on the desk top for the operator. It can be appreciated, however, that desk top space may become more and more cluttered to the detriment of anyone who works at the desk. Stacking drives one on top of another conserves desk top space, but as each additional drive is added to a stack, the center of gravity for the stack is elevated. Elevating the center of gravity of a stack of assemblies without increasing the size of its support base decreases the stability of the stack, i.e. it makes the stack of assemblies more prone to falling over when tilted. Further, as the stack of assemblies reaches three or four assemblies high, it becomes increasingly difficult for the operator to easily reach and turn each drive off.

Besides the physical task of reaching up to and turning OFF each assembly, the mental task of remembering to turn OFF each assembly which is ON becomes harder as the number of assemblies increases. Also, the likelihood of overlooking an assembly that is ON while turning the remaining assemblies OFF increases as the number of assemblies increases.

It is therefore an object of this invention to provide a base upon which various drives may be stacked in order to reduce the amount of area occupied by the various drives on an operator's desk.

It is another object of this invention to provide a base that simplifies the power ON and power OFF operations of the stack of assemblies mounted thereon.

It is another object of this invention to provide increased vertical stability to a stack of assemblies by adding a stabilizing base to the bottom thereof.

SUMMARY OF THE INVENTION

According to one aspect of the invention, the foregoing objects are achieved by providing an apparatus for switching AC power to an electronic assembly. The apparatus includes a base which has a front face, rear face and a pedestal portion. A track is formed on the pedestal portion for slidably engaging the electronic assembly. A power input connection point is attached to the base for receiving AC power from an external power line. An electrical plug is attached to the rear face and located to slidably engage and electrically connect the electronic assembly to the base. On the front face, a switch is attached for ON/OFF switching of the flow of AC power from the power input connection point via the electrical plug to the electronic assembly.

BRIEF DESCRIPTION OF THE DRAWINGS

While the specification concludes with the appended claims particularly pointing out and distinctly claiming the subject matter which is regarded as the invention, it is believed that the invention will be better understood from the following detailed description of the illustrative embodiment taken in conjunction with the accompanying drawings in which:

FIG. 3 is a perspective view of the base shown in FIG. 1 with an electronic assembly partially installed on the base;

DETAILED DESCRIPTION OF A PREFERRED EMBODIMENT

Figure 1:
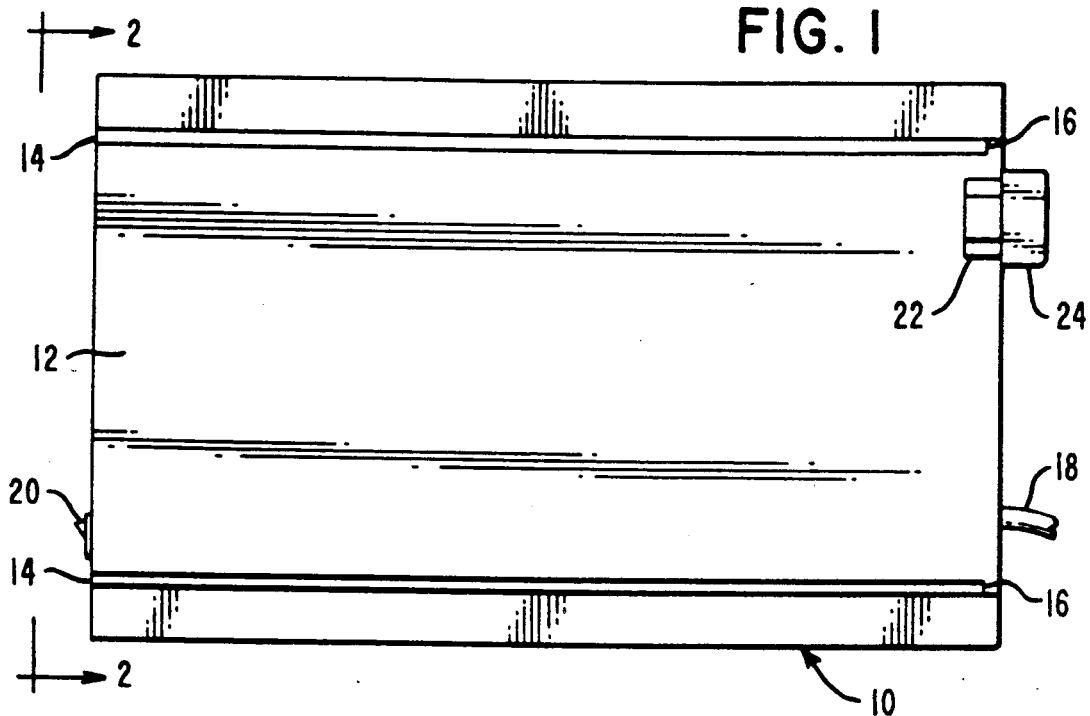
FIG. 1 is a plan view illustrating a base according to one embodiment of the present invention.

Referring to FIG. 1, there is shown a base 10 in accordance with the present invention. The base 10 has a raised pedestal portion 12 which is adapted for receiving one or more electronic assemblies (not shown in FIG. 1) of the type described in the co-pending U.S. patent application Ser. No. 423,928, filed Oct. 19, 1989 and entitled INTERLOCK ARRANGEMENT FOR STACKABLE ENCLOSURES. This co-pending application is commonly assigned to NCR Corporation and is designated as NCR Docket No. 4398, and the disclosure thereof is hereby incorporated by reference. The pedestal portion 12 has two tracks 14 formed in the top edges thereof. The tracks 14 run longitudinally almost the length of the pedestal 12 and terminate with a pair of stops 16 which inhibit further motion of the electronic assembly when mounted thereon.

An electric cord 18 is connected to the rear of the pedestal portion 12. This electric cord 18 may be a simple multi-conductor AC power cord, or in an alternate embodiment it may be a multi-conductor AC power cord which has a plug connector on one end that is similar to the plug 22 discussed below. In the alternate embodiment where the electric cord 18 is terminated with a plug (not shown) then the base 10 would be furnished with a mating plug of the type shown in FIG. 3 and discussed later. The electric cord 18 is connected to an ON/OFF switch 20 mounted on the front of the pedestal portion 12.

Figure 2:
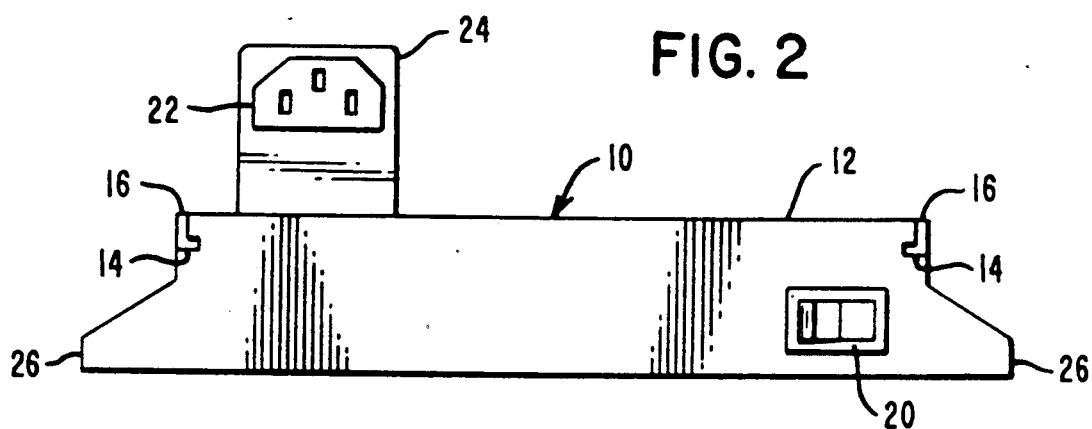
FIG. 2 is a front view of the base as seen at the plane represented by line 2—2 shown in FIG. 1.

Referring now to FIG. 2, the ON/OFF switch 20 is further connected to the plug 22 mentioned above. This plug 22 is shown to have a standard hexagon shape and sockets for three conductors in an industry standard arrangement. The plug 22 is held in spaced relationship with the pedestal 12 and the tracks 14 by a cantilevered support member 24. The cantilevered support member 24 also internally carries the conductors (not shown) from the switch 20 to the plug 22.

The interlocking "L" shape of the tracks 14 is shown in FIG. 2, but those skilled in the art will appreciated that other interlocking shapes may be selected instead of the "L" shape shown. On each side of the pedestal portion 12 in the transverse direction are flanges 26. These flanges 26 slightly increase the amount of desk space occupied by a stack of one or more electronic assemblies (see FIG. 3), but also increases the stability, i.e. tilt resistance, of a base-stack combination.

Figure 4:
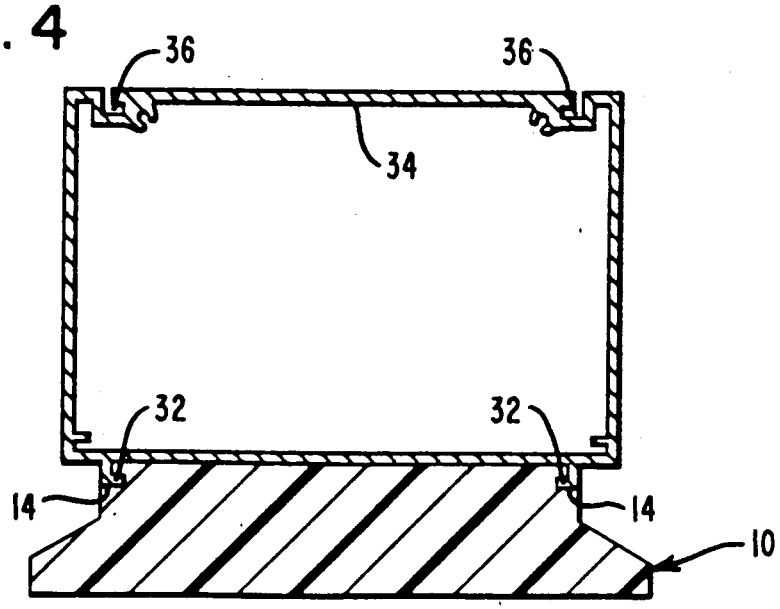
FIG. 4 is a sectional view as seen at the plane represented by line 4—4 shown in FIG. 3.
Figure 5:
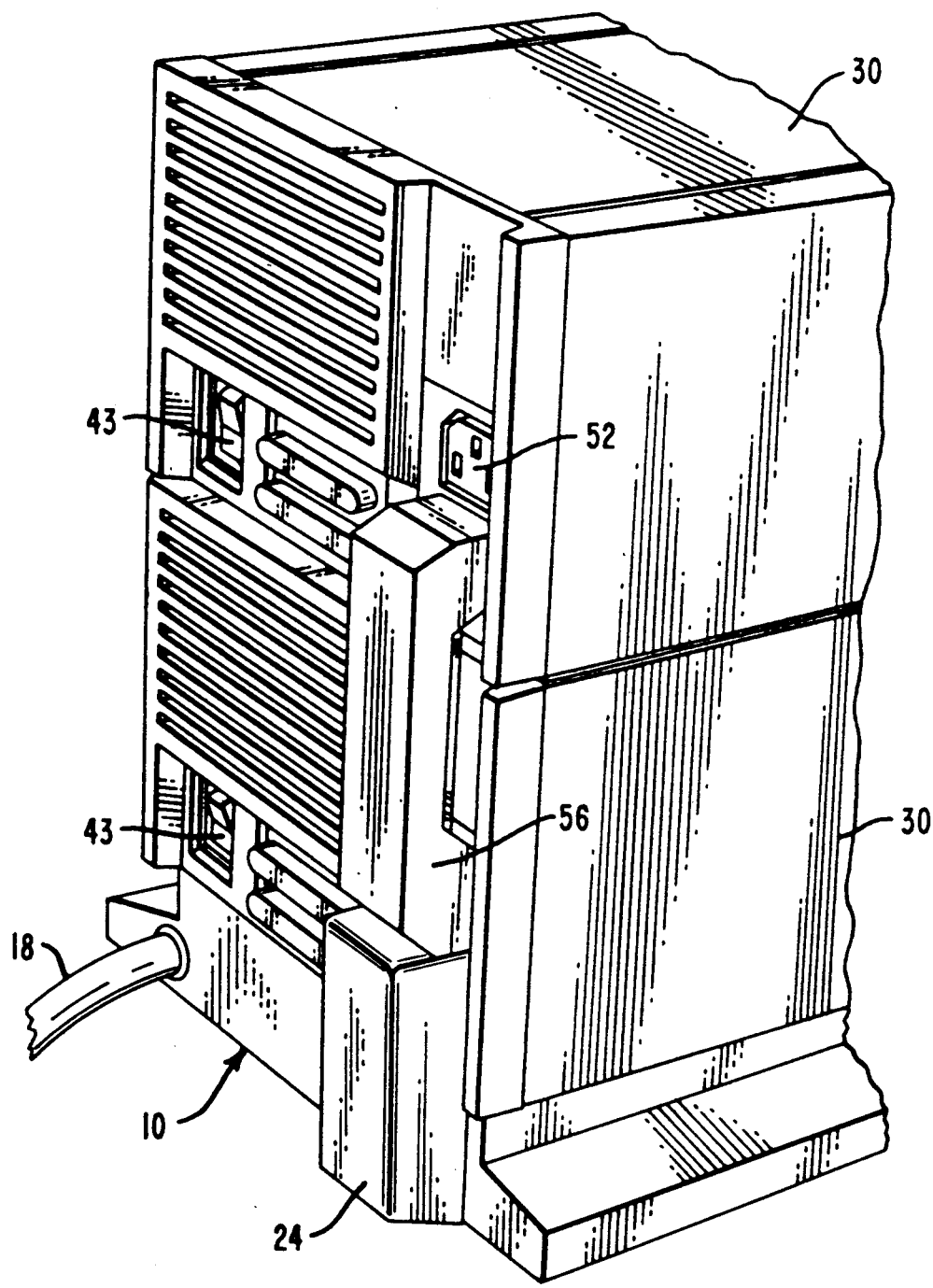
FIG. 5 is a partially broken away perspective view of the base shown in FIG. 1 with two electronic assemblies installed in a stack.

FIGS. 3 and 4 show how an electronic assembly 30 with its interlocking protrusions 32 slidably engage the tracks 14 of the base 10. The enclosure 34 of the electronic assembly 30 is a single piece extrusion. The interlocking protrusions 32 are integrally formed as part of the extrusion process of the enclosure 34, as are the interlocking channels 36 formed in the top portion of the enclosure 34. By slidably engaging a successive electronic assembly 30 with an externally similar electronic assembly 30, an interlocked stack of assemblies 30 may be built up on the base 10. A stack of two assemblies is illustrated in FIG. 5. Tests have shown that a stack of four assemblies 30 interlocked upon a base 10 can be inclined 15 degrees from the vertical in any direction without falling over, while without the base 10 a stack of three assemblies 30 will fall over if inclined fifteen degrees from the vertical in the transverse direction.

Referring back to FIG. 3, the plug 22 is shown cantilevered in its spaced location by support 24. In this spaced location, the plug 22 slidably engages with power receptacle 42 of the electronic assembly 30. The receptacle 42 provides power to its own ON/OFF switch 43 and also to powerout plug 52 which is similar in shape and construction to plug 22 of the base 10. The plug 52 is mounted with a gap 54 surrounding it such that industry standard hooded receptacles (not shown) may be connected thereto in order to conduct AC power to an additional assembly 30 or other device.

Referring to FIG. 5, the stack of two assemblies 30 is illustrated. The lower electronic assembly 30 is completely engaged with the base 10, the tracks 14, and the plug 22 (not visible in FIG. 5 because it is hidden by support 24). AC power is conducted from lower plug 52 (not shown in FIG. 5) to upper receptacle 42 of the upper assembly 30 by an AC power jumper 56. If other electronic assemblies 30 are added to the stack, then AC power may be provided to each additional electronic assembly by connecting the next unused plug 52 to the receptacle 42 (see FIG. 4) of the added electronic assembly 30 with an additional AC power jumper 56.

When the electronic assemblies 30 are stacked and jumpered as shown in FIG. 5, AC power to the stack flows in through the power cord 18. As previously described AC power may flow from the AC power cord 18 to the ON/OFF switch 20 (shown in FIG. 1 and 2) of the base 10. When switches 20 and 43 are in the ON position, AC power flows from the ON/OFF switch 20 (not shown in FIG. 5) to the plug 22 (shown in FIGS. 1, 2 and 3) and from there to the receptacle 42 (shown in FIG. 3). Each plug 52 is electrically connected in parallel with the conductors of its respective receptacle 42. Thus, each AC power jumper 56 connecting the lower plug 52 (not shown in FIG. 5) with the upper receptacle 42 (not shown) will connect each so jumpered assembly 30 to the flow of AC power. And, when ON/OFF switch 20 (see FIGS. 1 or 2) is in the OFF position, the flow of AC power to the stack of electronic assemblies is turned OFF by the control thereof.

Thus, it will now be understood that there has been disclosed a base for stackable electronic assemblies which provides increased mechanical stability and also single switch ON/OFF control. While the invention has been particularly illustrated and described with reference to a preferred embodiment thereof, it will be understood by those skilled in the art that various changes in form, details, and applications may be made therein. It is accordingly intended that the appended claims shall cover all such changes in form, details and applications which do not depart from the true spirit and scope of the invention.

What is claimed as new and desired to be secured by Letters Patent of the United States is:

1. An apparatus for switching a flow of AC power to an electronic assembly, comprising:
    a base having a front face, rear face and a pedestal portion;
    track means formed on said pedestal portion for slidably engaging an electronic assembly;
    track means formed on said pedestal portion for slidably engaging an electronic assembly;
    a first electronic assembly having means for slidably engaging said track means;
    said slidably engaging means being engaged with said track means;
    power input means attached to said base for receiving AC power from an external source;
    a plug attached to said rear face for slidably engaging and electrically connecting said first electronic assembly to said base;
    a switch attached to said front face for ON/OFF switching the flow of AC power from said power input means via said plug to said first electronic assembly; and
    a second electronic assembly slidably engaged atop said first electronic assembly and electrically connected to said first electronic assembly for receiving AC power therefrom, such that said switch switches a flow of AC power to said second electronic assembly in the same manner that it switches the flow of AC power to said first electronic assembly.

2. An apparatus for switching a flow of AC power to an electronic assembly, comprising:

a base having a front face, rear face and a pedestal portion;

track means formed on said pedestal portion for slidably engaging an electronic assembly;

an electronic assembly having means for slidably engaging said track means;

said slidably engaging means being engaged with said track means;

power input means attached to said base for receiving AC power from an external source;

a plug attached to said rear face for slidably engaging and electrically connecting said electronic assembly to said base; and a switch attached to said front face for ON/OFF switching the flow of AC power from said power input means via said plug to said electronic assembly;

wherein said base has a widened portion at the bottom thereof to increase a vertical stability of a combination of said base engaged with said electronic assembly, and a second electronic assembly mounted atop said electronic assembly.

3. An apparatus, comprising:

a base having a front portion, a rear portion and a pedestal portion;

track means for engaging an electronic assembly longitudinally formed on said pedestal portion;

a first electronic assembly having means for slidably engaging said track means;

said slidably engaging means being engaged with said track means;

power input means attached to said base for receiving a flow of AC power from an external source;

a plug attached to said rear portion for slidably engaging and electrically connecting said first electronic assembly with said base; and a switch attached to said front portion for ON/OFF switching a flow of AC power from said power input means via said plug to said first electronic assembly; and a second electronic assembly engaged atop said first electronic assembly and connected to receive a flow of AC power from said first electronic assembly under control of said switch.

4. An apparatus according to claim 3, further comprising a third electronic assembly engaged atop said second electronic assembly and connected to receive a flow of AC power from said second electronic assembly under control of said switch.

5. An apparatus according to claim 4, further comprising a fourth electronic assembly engaged atop said third electronic assembly and connected to receive a flow of AC power from said third electronic assembly under control of said switch.

6. An apparatus according to claim 4, wherein said base has a widened portion at the bottom thereof to increase a stability of said electronic assemblies stacked thereon.

7. An apparatus according to claim 5, wherein said has a widened portion at the bottom thereof to increase a stability of said electronic assemblies stacked thereon.

8. An apparatus according to claim 6, wherein said stability is increased to withstand a fifteen degree inclination in any direction from the vertical without falling over.

9. An apparatus according to claim 7, wherein said stability is increased to withstand a fifteen degree inclination in any direction from the vertical without falling over.

* * * * *

UNITED STATES PATENT AND TRADEMARK OFFICE
CERTIFICATE OF CORRECTION

PATENT NO. : 4,996,628

DATED : February 26, 1991

INVENTOR(S) : Robert T. Harvey et al.

It is certified that error appears in the above-identified patent and that said Letters Patent is hereby corrected as shown below:

Column 4, line 44, should be deleted.

Column 4, line 45, should be deleted.

Column 6, line 1, "to" should be --at--.

Column 6, line 26, after the word "said" insert --base--.

Signed and Sealed this

Thirtieth Day of June, 1992

Attest:

DOUGLAS B. COMER

Attesting Officer

Acting Commissioner of Patents and Trademarks